United States Patent
Iizawa

(10) Patent No.: US 8,063,534 B2
(45) Date of Patent: Nov. 22, 2011

(54) SURFACE ACOUSTIC WAVE DEVICE AND SURFACE ACOUSTIC WAVE OSCILLATOR

(75) Inventor: Keigo Iizawa, Minowa-machi (JP)

(73) Assignee: Seiko Epson Corporation, Tokyo (JP)

( * ) Notice: Subject to any disclaimer, the term of this patent is extended or adjusted under 35 U.S.C. 154(b) by 285 days.

(21) Appl. No.: 12/368,783

(22) Filed: Feb. 10, 2009

(65) Prior Publication Data

US 2009/0206955 A1 Aug. 20, 2009

(30) Foreign Application Priority Data

Feb. 20, 2008 (JP) ................................. 2008-038951
Nov. 10, 2008 (JP) ................................. 2008-287745

(51) Int. Cl.
*H01L 41/09* (2006.01)
(52) U.S. Cl. ............ 310/313 B; 310/313 A; 310/313 R; 310/313 D
(58) Field of Classification Search ............. 310/313 B, 310/313 D, 313 R, 313 A; 333/193, 195; H01L 41/09

See application file for complete search history.

(56) References Cited

U.S. PATENT DOCUMENTS

| | | | | |
|---|---|---|---|---|
| 4,249,146 A * | 2/1981 | Yen et al. | ....................... | 333/195 |
| 5,179,310 A | 1/1993 | Satoh et al. | | |
| 6,154,105 A | 11/2000 | Fujimoto et al. | | |
| 6,414,414 B1 | 7/2002 | Wright | | |
| 6,759,928 B2 * | 7/2004 | Endou et al. | .................. | 333/193 |
| 6,856,218 B2 * | 2/2005 | Yamazaki et al. | ........ | 310/313 A |
| 7,109,828 B2 | 9/2006 | Takayama et al. | | |
| 7,696,675 B2 * | 4/2010 | Kanna | ...................... | 310/313 D |

FOREIGN PATENT DOCUMENTS

| | | |
|---|---|---|
| JP | A-54-156455 | 12/1979 |
| JP | A-61-092011 | 5/1986 |
| JP | A-61-92011 | 5/1986 |
| JP | A-01-231412 | 9/1989 |
| JP | A-1-231412 | 9/1989 |
| JP | A-3-284009 | 12/1991 |
| JP | A-10-270974 | 10/1998 |
| JP | A-11-214958 | 8/1999 |
| JP | A-11-298290 | 10/1999 |
| JP | A-2000-188521 | 7/2000 |
| JP | A-2002-100959 | 4/2002 |
| JP | A-2002-517933 | 6/2002 |
| JP | A-2003-124780 | 4/2003 |
| JP | A-2003-152487 | 5/2003 |
| JP | A-2003-258601 | 9/2003 |

(Continued)

*Primary Examiner* — Thomas Dougherty
*Assistant Examiner* — Karen Addison
(74) *Attorney, Agent, or Firm* — Oliff & Berridge, PLC

(57) ABSTRACT

A surface acoustic wave device, includes: an interdigital transducer serving as an electrode pattern to excite a Rayleigh surface acoustic wave, the interdigital transducer including a comb-tooth-shaped electrode having a plurality of electrode fingers; a piezoelectric substrate on which the interdigital transducer is formed, the piezoelectric substrate being made of a quartz substrate that is cut out at a cut angle represented by an Euler angle representation ($\phi$, $\theta$, $\Psi$) of (0°, 95°≦$\theta$≦155°, 33°≦|$\Psi$|≦46°); electrode finger grooves formed between the electrode fingers of the comb-tooth-shaped electrode; and electrode finger bases being quartz portions sandwiched between the electrode finger grooves and having upper surfaces on which the electrode fingers are positioned. The surface acoustic wave device provides an excitation in an upper limit mode of a stop band of the surface acoustic wave.

7 Claims, 10 Drawing Sheets

FOREIGN PATENT DOCUMENTS

| | | |
|---|---|---|
| JP | A-2005-12736 | 1/2005 |
| JP | A-2005-204275 | 7/2005 |
| JP | A-2006-74136 | 3/2006 |
| JP | A-2006-148622 | 6/2006 |
| JP | A-2006-186623 | 7/2006 |
| JP | A-2006-203408 | 8/2006 |
| JP | A-2006-295311 | 10/2006 |
| JP | A-2007-28664 | 2/2007 |
| JP | A-2007-74754 | 3/2007 |
| JP | A-2007-142794 | 6/2007 |
| JP | A-2007-208871 | 8/2007 |
| JP | A-2007-259414 | 10/2007 |
| JP | A-2007-267033 | 10/2007 |
| JP | A-2007-281701 | 10/2007 |
| JP | A-2007-300174 | 11/2007 |
| JP | A-2007-300287 | 11/2007 |
| JP | A-2008-78984 | 4/2008 |

* cited by examiner

SURFACE ACOUSTIC WAVE DEVICE AND SURFACE ACOUSTIC WAVE OSCILLATOR

BACKGROUND

1. Technical Field

The present invention relates to a surface acoustic wave device using an upper limit mode of a stop band of a Rayleigh surface acoustic wave and a surface acoustic wave oscillator including the surface acoustic wave device.

2. Related Art

An interdigital transducer (IDT) and a reflector that constitute a surface acoustic wave element include a plurality of conductive strips. The conductor strips have a periodic structure that provides a frequency band, i.e., a stop band, to reflect a surface acoustic wave (SAW) of a specific frequency domain by a high reflection coefficient, A surface acoustic wave device made of an ST-cut quartz substrate with a predetermined in-plane rotated angle $\Psi$ and enabling an excitation of an upper limit mode of a stop band of Rayleigh surface acoustic waves is known for having an excellent frequency temperature characteristic. Further, a single type IDT only having two electrode fingers in a wavelength of surface acoustic waves can be employed, as it is known, reducing difficulty in miniaturizing electrodes when a frequency is increased and facilitating the increase of the frequency compared to a case of employing a reflection/inversion type IDT electrode (including three electrode fingers in a wavelength of surface acoustic waves) that is required to excite an upper limit of a stop band in related art. Furthermore, it is also known that an excitation of an upper limit mode of a stop band has a smaller frequency variation when a thickness of an electrode film is increased so as to reduce a resistance value of an IDT, i.e., a frequency variation caused by a variation of the thickness of the electrode film, compared to an excitation of a lower limit mode (refer to JP-A-2006-148622 that is a first example of related art).

The first example of related art discloses that a SAW of the upper limit mode of the stop band becomes excitable when a propagation direction of the SAW is shifted from an X axis of quartz crystal.

In JP-A-11-214958 that is a second example of related art, it is described that a stop band is formed by a periodic reflection of a SAW caused by a periodic configuration in which a number of electrode fingers are aligned, and further a reflection/inversion type IDT is also disclosed in detail. Furthermore, according to the description, frequencies of a lower end (lower limit) and an upper end (upper limit) in the stop band are in a resonated state, generating standing waves. Positions of anti-nodes (or nodes) of respective standing waves of the lower limit mode and the upper limit mode are thus shifted from each other.

Such a surface acoustic wave device disclosed in the first example of related art can surely exhibit an excellent frequency temperature characteristic, be suitable for increasing frequencies, and reduce a variation amount of the frequencies caused by a variation of the film thickness. However, in the first example of related art, manufacturing errors in mass production is not considered. For example, in a manufacturing process of a SAW device, when a resist pattern is formed and an electrode pattern is formed by wet etching, a difference in the thickness or the width of the resist pattern, and influence of side etching proceeding etching from side surfaces of the electrode pattern may cause errors in a line width of electrode fingers constituting an IDT. When the electrode pattern is formed by dry etching, a variation in the line width of the electrode fingers due to the side etching is reduced. However, a variation in the line width of the electrode fingers caused by a variation of the thickness and the width of the resist pattern may occur similarly to the case of wet etching.

Further, in a surface acoustic wave device made of a quartz crystal substrate with an in-plane rotated angle as disclosed in the first example of related art, when a line metalization ratio $\eta$ between individual products varies due to manufacturing errors or the like, a variation amount of frequencies when a temperature is changed may largely change. That is, a variation in a frequency temperature characteristic becomes large. This becomes a major issue in reliability and quality of products in mass production in which a variation of line widths occurs to no small extent.

SUMMARY

Advantages of the invention are to provide a surface acoustic wave (SAW) device that is suitable for mass production because a difference of a frequency variation caused by a temperature change between individual SAW devices when a line width of electrode fingers is varied, i.e., a variation of a frequency characteristic, is reduced, and to provide a surface acoustic wave oscillator including the SAW device.

The advantages of the invention described above can be realized as described below.

A surface acoustic wave device includes an interdigital transducer at least serving as an electrode pattern to excite a Rayleigh surface acoustic wave, the interdigital transducer including a comb-tooth-shaped electrode having a plurality of electrode fingers; a piezoelectric substrate on which the interdigital transducer is formed, the piezoelectric substrate being made of a quartz substrate that is cut out at a cut angle represented by an Euler angle representation ($\phi$, $\theta$, $\Psi$) of (0°, 95°$\leq\theta\leq$155°, 33°$\leq|\Psi|\leq$46°); electrode finger grooves formed between the electrode fingers of the comb-tooth-shaped electrode; and electrode finger bases being quartz portions sandwiched between the electrode finger grooves and having upper surfaces on which the electrode fingers are positioned. The surface acoustic wave device provides an excitation in an upper limit mode of a stop band of the surface acoustic wave.

This configuration can reduce divergence between peak temperatures of a frequency temperature characteristic of individual devices even when errors occur in a line width of the electrode fingers constituting the interdigital transducer in a manufacturing process. Therefore, a difference of a frequency variation in a range of an operating temperature is reduced, allowing the surface acoustic wave device to be suitable for mass production That is, a variation of the frequency temperature characteristic among individual surface acoustic wave devices is reduced.

The surface acoustic wave device further may include a reflector formed at both sides of the interdigital transducer so as to sandwich the interdigital transducer in a propagation direction of the surface acoustic wave on a surface of the quartz substrate. The reflector includes: conductor strips; conductor strip grooves formed between the conductor strips; and conductor strip bases being sandwiched between the conductor strip grooves and having upper surfaces on which the conductor strips are formed.

This can improve reflection efficiency of the surface acoustic wave at the reflector.

In the surface acoustic wave device, fr1<ft2<fr2 may be satisfied, where an upper end frequency of a stop band of the interdigital transducer is ft2, a lower end frequency of a stop band of the reflector is fr1, and an upper end frequency of the stop band of the reflector is fr2.

According to this, a reflection coefficient |Γ| of the reflector increases at the frequency ft2 of the upper end of the stop band of the interdigital transducer, while the surface acoustic wave in the upper limit mode of the stop band excited by the interdigital transducer is reflected towards the interdigital transducer with a high reflection coefficient at the reflector. Then, energy trapping of the surface acoustic wave in the upper limit mode of the stop band becomes stronger, thereby realizing a low loss resonator.

In the surface acoustic wave device, the conductor strip grooves of the reflector may be shallower than the electrode finger grooves of the interdigital transducer in depth.

This enables the stop band of the reflector to shift towards a higher frequency than the stop band of the interdigital transducer. Therefore, the relation of fr1<ft2<fr2 can be realized.

In the surface acoustic wave device, a relation of y and a value Hd/H may satisfy $y = 0.1825 \times (Hd/H)^4 - 0.1753 \times (Hd/H)^3 + 0.0726 \times (Hd/1)^2 - 0.0058 \times (Hd/H) + 0.0085$, where a line metalization ratio η of the electrode fingers included in the interdigital transducer is 0.8±y, and the value Hd/H is obtained by dividing a thickness Hd of the electrode finger base by a total thickness H of the electrode finger and the electrode finger base.

In this case, based on the value Hd/H, a tolerance y of the line metalization ratio that can favorably maintain the frequency temperature characteristic can be obtained.

Further, in this case, the value Hd/H may be 0.167 or more. This can suppress the variation of the frequency temperature characteristic in a range from 0 degrees Celsius to 80 degrees Celsius within 15 ppm.

In the surface acoustic wave device, the value Hd/H may be from 0.3 inclusive to 0.833 inclusive. In this case, the frequency variation in the range from 0 degrees Celsius to 80 degrees Celsius is made within 20 ppm.

A surface acoustic wave oscillator includes the surface acoustic wave device according to the above, and an integrated circuit (IC) for driving the interdigital transducer.

BRIEF DESCRIPTION OF THE DRAWINGS

The invention will be described with reference to the accompanying drawings, wherein like numbers reference like elements.

DESCRIPTION OF EXEMPLARY EMBODIMENTS

Embodiments of a surface acoustic wave device and a surface acoustic wave oscillator will now be described in detail referring to the attached drawings.

Figure 1:
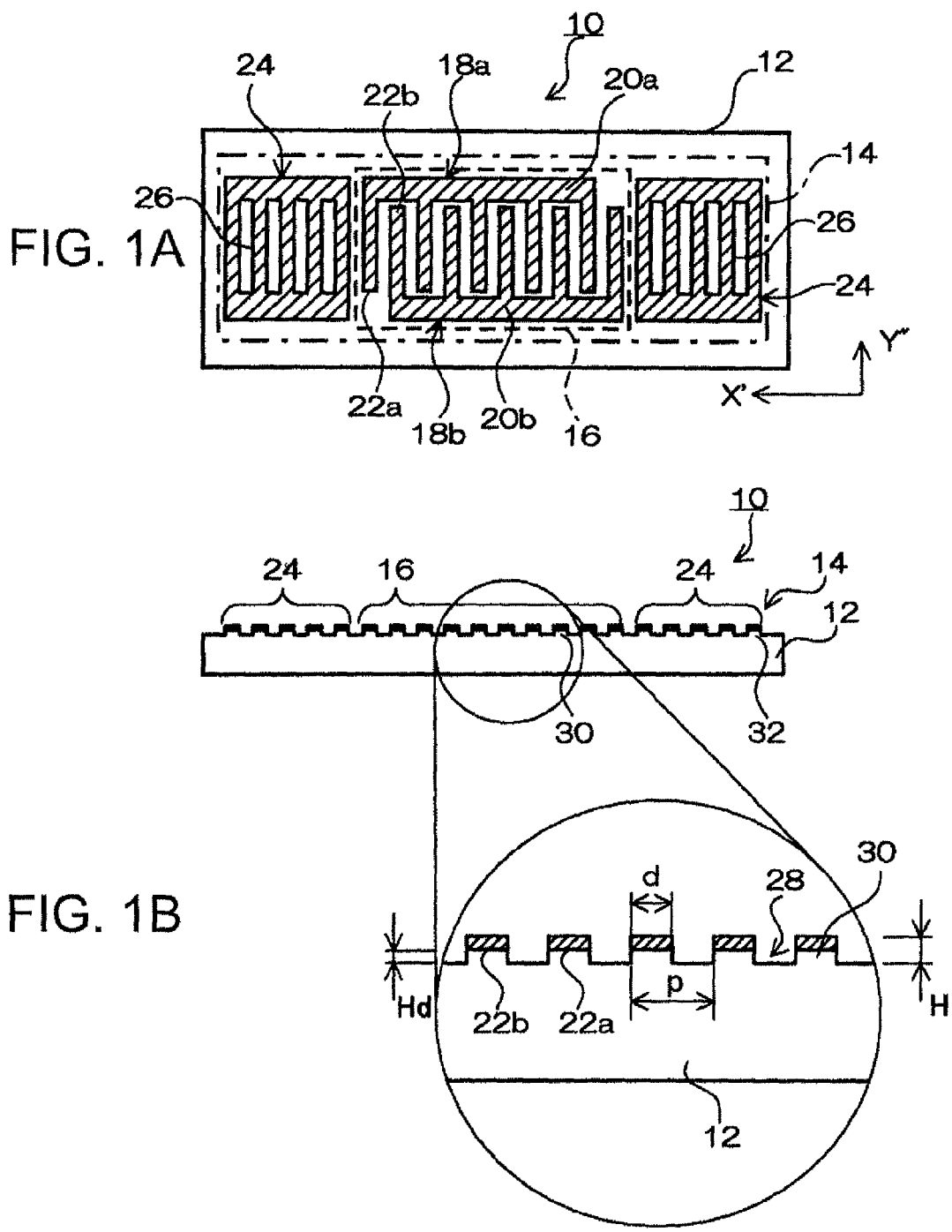
FIGS. 1A and 1B are diagrams showing a configuration of a SAW device according to an embodiment.
Figure 2:
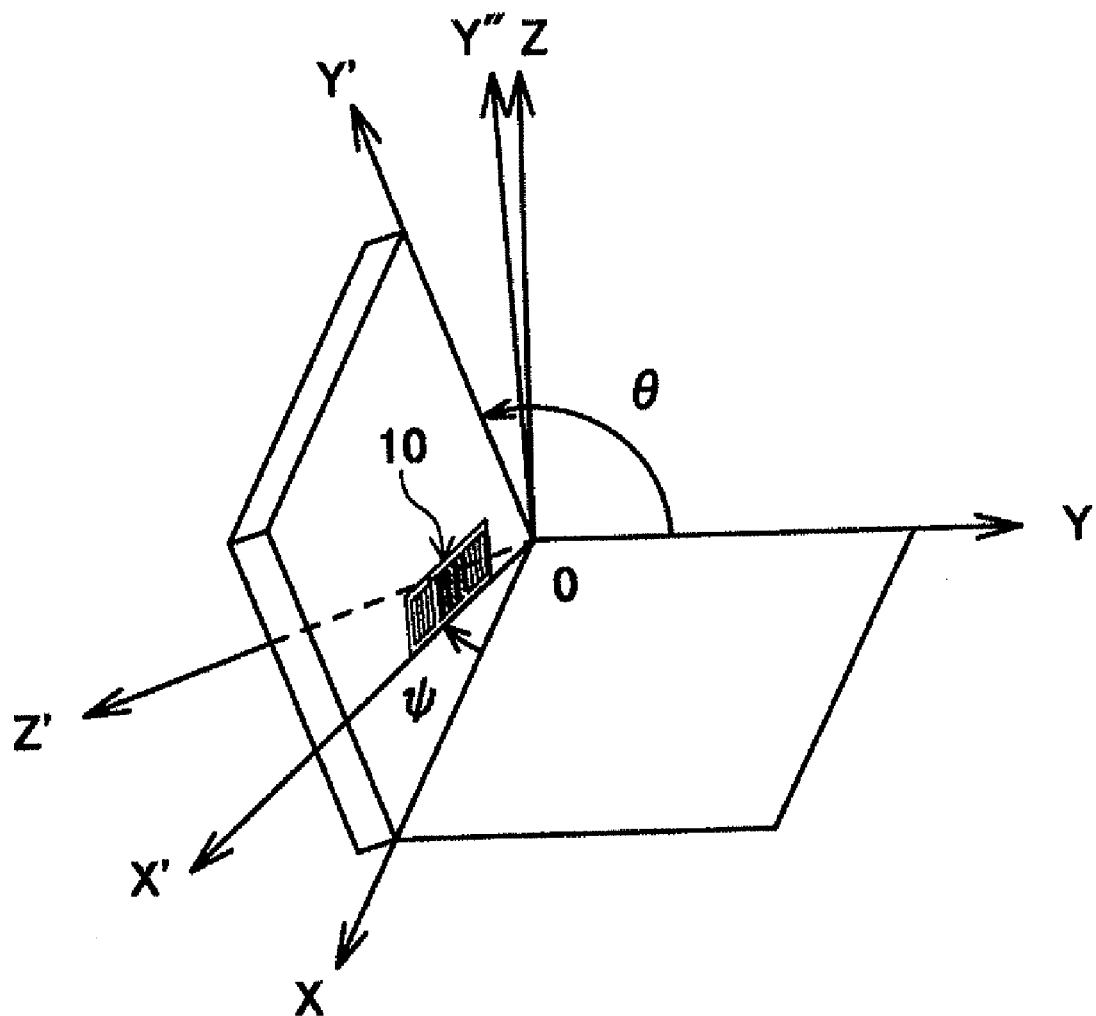
FIG. 2 is a diagram showing a cut angle of a quartz substrate constituting the SAW device according to the embodiment.

A surface acoustic wave (SAW) device 10 according to an embodiment is a resonance type SAW device basically including a piezoelectric substrate 12, an interdigital transducer (IDT) 16, and reflectors 24, as shown in FIGS. 1A and 1B. As shown in FIG. 2, the piezoelectric substrate 12 is made of a quartz substrate having crystal axes represented by an X axis (electrical axis), a Y axis (mechanical axis), and a Z axis (optical axis).

Here, Euler angle will be explained. A substrate represented as the Euler angle (0°, 0°, 0°) is a Z-cut substrate having a main surface perpendicular to the Z axis. In the Euler angle (φ, θ, Ψ) here, φ relates to a first rotation of the Z-cut substrate, and represents a first rotation angle when the Z axis is a rotation axis and a direction to rotate from +X axis to +Y axis is a positive rotation angle. Further, θ of the Euler angle relates to a second rotation performed after the first rotation of the Z-cut substrate, and represents a second rotation angle when the X axis after the first rotation is the rotation axis and a direction to rotate from +Y axis after the first rotation to +Z axis is a positive rotation angle. A cut surface of a piezoelectric substrate is determined based on the first rotation angle φ and the second rotation angle θ. Further, Ψ of the Euler angle relates to a third rotation performed after the second rotation of the Z-cut substrate, and represents a third rotation angle when the Z axis after the second rotation is the rotation axis and a direction to rotate from +X axis after the second rotation to +Y axis after the second rotation is a positive rotation angle. A propagation direction of the SAW is represented by the third rotation angle Ψ with respect to the X axis after the second rotation.

In the embodiment, an in-plane rotation ST cut quartz substrate represented by an Euler angle (0°, 95°≦θ≦155°, 33°≦|Ψ|≦46°) is employed. Such an in-plane rotation ST cut quartz substrate can constitute a SAW device with less frequency variations corresponding to temperature variation and an excellent frequency temperature characteristic.

The IDT 16 is provided with a pair of comb-tooth-shaped electrodes 18 (18a and 18b) including a plurality of electrode fingers 22 (22a and 22b) whose base portions are coupled by bus bars 20 (20a and 20b). The electrode finger 22a constituting the comb-tooth-shaped electrode 18a and the electrode finger 22b constituting the comb-tooth-shaped electrode 18b are alternately arranged at a predetermined interval. Here, the electrode fingers 22 are arranged in a direction orthogonal to an X' axis that is the propagation direction of the SAW. The SAW excited by the SAW device 10 constituted as above is a Rayleigh surface acoustic wave. When the propagation direction of the surface acoustic wave is shifted from the X axis that is a crystal axis of quartz crystal as above, the SAW in the upper limit mode of a stop band is successfully excited.

Further, the reflectors 24 are formed in pairs so as to sandwich the IDT 16 in the propagation direction of the SAW. Specifically, a plurality of conductor strips 26 which are formed parallel to the electrode fingers 22 constituting the IDT 16 are coupled to each other at both ends.

Examples of an electrode material forming the IDT 16 and the reflectors 24 constituted as above may include aluminum (Al), Al alloy, silver (Ag), tungsten (W), tantalum (Ta), copper (Cu), or an alloy including one of these materials as a main constituent. When an alloy is used as the electrode material, metal other than metal that is the main constituent should be included at 10% or less by weight.

The SAW device 10 according to the embodiment, which is basically configured as above, enables an excitation in the upper limit mode of the stop band since the propagation direction of the SAW is shifted from the X axis that is the crystal axis of quartz crystal as described above. Further, the SAW device 10 according to the embodiment has electrode finger bases formed by digging a surface of the quartz substrate at a predetermined amount except for a portion of the surface to form the electrode pattern 14 so as to form grooves (grooves between electrode fingers) 28 between the electrode fingers 22 of the IDT 16. This configuration can reduce variations of the frequency temperature characteristic in a case where the line metalization ratio η of the electrode fingers 22 constituting the IDT 16 varies. The line metalization ratio η is obtained by dividing a line width d of the electrode fingers 22 by a pitch p between the electrode fingers 22. Therefore, the line metalization ratio η is expressed by Formula 1.

$$\eta = \frac{d}{p} \quad \text{Formula 1}$$

Next, an example of a case where the grooves 28 are not formed between the electrode fingers 22 and another example of a case where the grooves 28 are formed between the electrode fingers 22 are described so as to show differences of frequency variations depending on the configuration.

When a case of a SAW resonator having a resonant frequency of 322 MHz is exemplified, the thickness of an electrode film may be set at 0.6 µm as an example of a design value. On the other hand, in the case of the SAW device 10 (resonator) according to the embodiment, for example, half of the electrode film thickness, that is about 0.3 µm is compensated by a digging amount of the grooves 28 (Here, the grooves between electrode fingers 22 are defined as electrode finger grooves, while the grooves between the conductor strips are defined as conductor strip grooves. Hereinafter, the electrode finger grooves and the conductor strip grooves may correctively be referred to as "grooves".) and then bases of quartz crystal (the electrode finger bases 30 and conductor strip bases 32) are formed, so that the IDT 16 and the reflectors 24 with an actual electrode film thickness of 0.3 µm are formed.

In this case, only the electrode finger grooves in the IDT 16 may be formed, but the conductor strip grooves in the reflectors 24 may not be formed. However, similarly to the embodiment, a case where not only the electrode finger grooves in the IDT 16, but also the conductor strip grooves in the reflectors 24 are formed is preferable because a reflection coefficient of the SAW in the reflectors 24 can be increased.

Figure 3A:
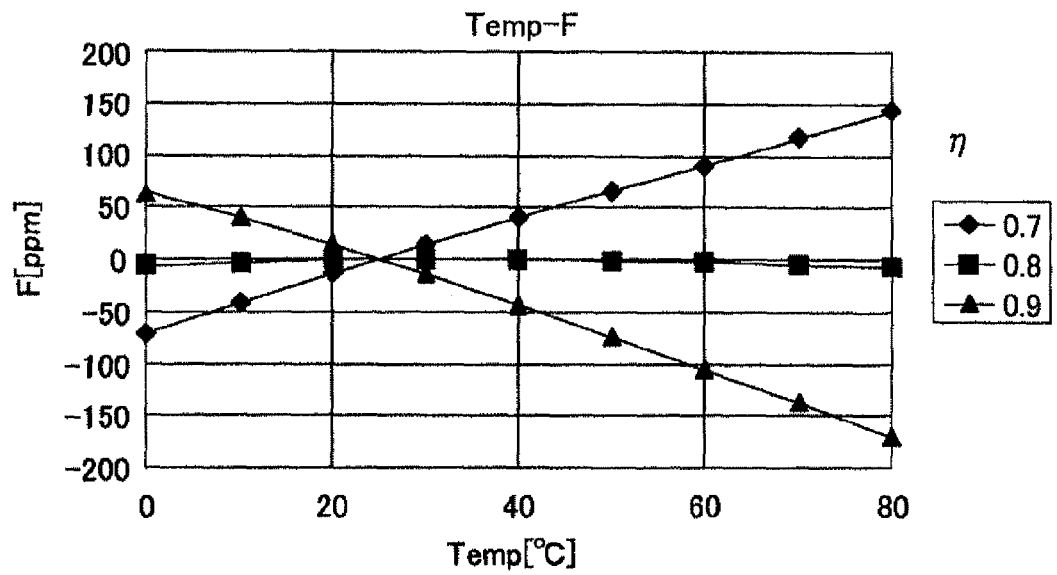
FIGS. 3A and 3B are graphs showing differences of frequency variations when the line metalization ratios η of a SAW device in related art and the SAW device of the embodiment are varied by ±0.1.
Figure 3B:
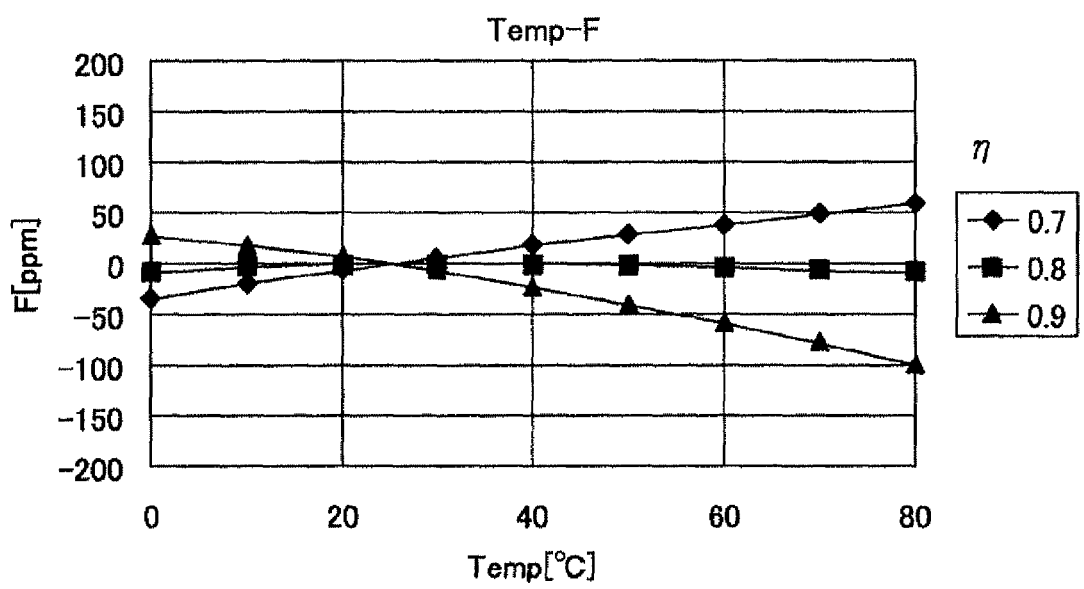

FIGS. 3A and 3B show changes in the frequency temperature characteristics between the case where the grooves 28 are not formed, and the case where the grooves 28 are formed not formed between the electrode fingers of the IDT 16 or the like. FIG. 3A shows the case where the grooves 28 are not formed between the electrode fingers, while FIG. 3B shows the case where the grooves 28 are formed. In FIGS. 3A and 3B, a vertical axis indicates variation amounts of the frequency while a horizontal axis indicates temperatures.

In the both cases with the grooves 28 and without grooves 28 respectively shown in FIGS. 3A and 3B, the line metalization ratio η is set at 0.8 as a target value and a case where the line metalization ratio η is varied by ±0.1 from the target value is exemplified. As it is found in FIG. 3A, in the case without the grooves 28, when the line metalization ratio η is 0.9, the frequency variation in a range of an operating temperature is up to about 170 ppm. On the other hand, as shown in FIG. 3B, in the case where the grooves 28 are formed, even when the line metalization ratio η is 0.9, the frequency variation in the range of the operating temperature can be up to about 100 ppm. Further, the variation of the frequency temperature characteristic caused by the variation of the line metalization ratio η is smaller in the case where the grooves 28 are formed. Accordingly, when the grooves 28 are formed, the maximum frequency variation can be reduced in addition to that the variation of the frequency temperature characteristic caused by the variation of the line metalization ratio η is reduced.

Here, in the examples shown in FIGS. 3A and 3B, the varied range of the line metalization ratio η is set at ±0.1 in order to facilitate the explanation. However, the variation of the line metalization ratio η in an actual manufacturing process is about 0.01. In the SAW device 10 (e.g. SAW resonator) manufactured with such accuracy, it is preferable that the frequency variation be suppressed up to about ±50 ppm (100 ppm in an operating temperature range from −40 to 85 degrees Celsius) from the resonant frequency (e.g. 322 MHz) at a reference temperature (e.g. 25 degrees Celsius) in a range between 0 and 80 degrees Celsius. Further, it is desirable that the frequency variation be suppressed to within about ±10 ppm (20 ppm or less in width) in the range between 0 to 80 degrees Celsius.

Under such relations and conditions, a method to obtain a relation between tolerances of the groove depth and the line metalization ratio η, and an optimum depth of the grooves includes the followings. That is, in a case where the piezoelectric substrate 12 made of quartz crystal has the grooves 28 formed on a surface thereof in a predetermined depth, a target line metalization ratio η, the varied range of the line metalization ratio η, and a frequency variation in a predetermined temperature range (e.g. between 0 and 80 degrees Celsius) when the line metalization ratio η is ±0.01 are respectively obtained. Then, a maximum value and a minimum value of the frequency variation based on the varied range of the line metalization ratio η are obtained. Thereafter, the groove depth in a range of the frequency variation (e.g. within 15 ppm) allowing a difference between the maximum value and the minimum value is obtained.

Figure 4:
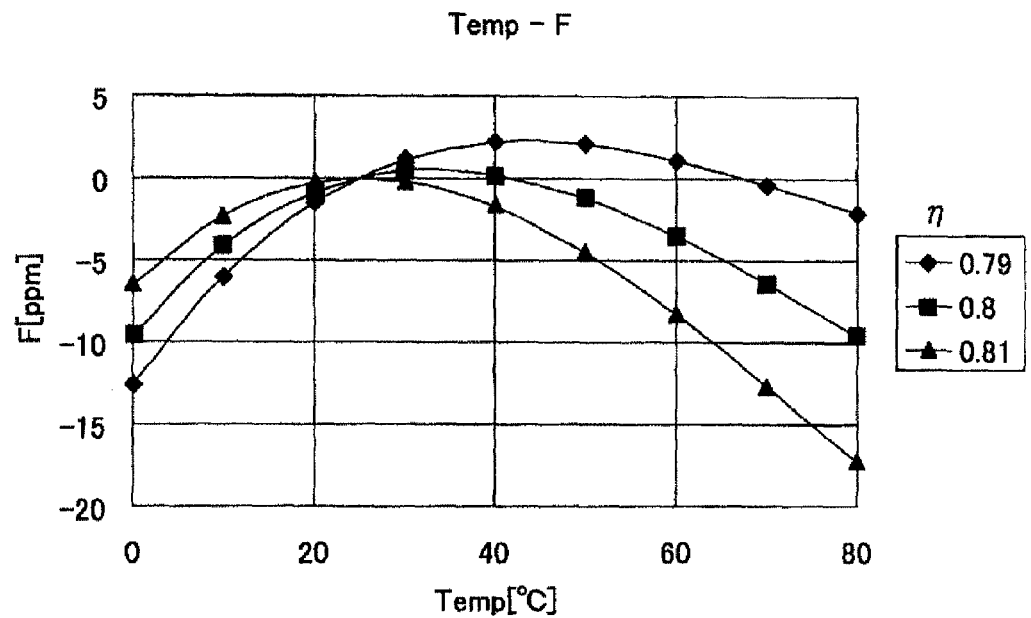
FIG. 4 is a graph showing differences of frequency variations when line metalization ratio η of the SAW device of the embodiment is varied by ±0.01.
Figure 5:
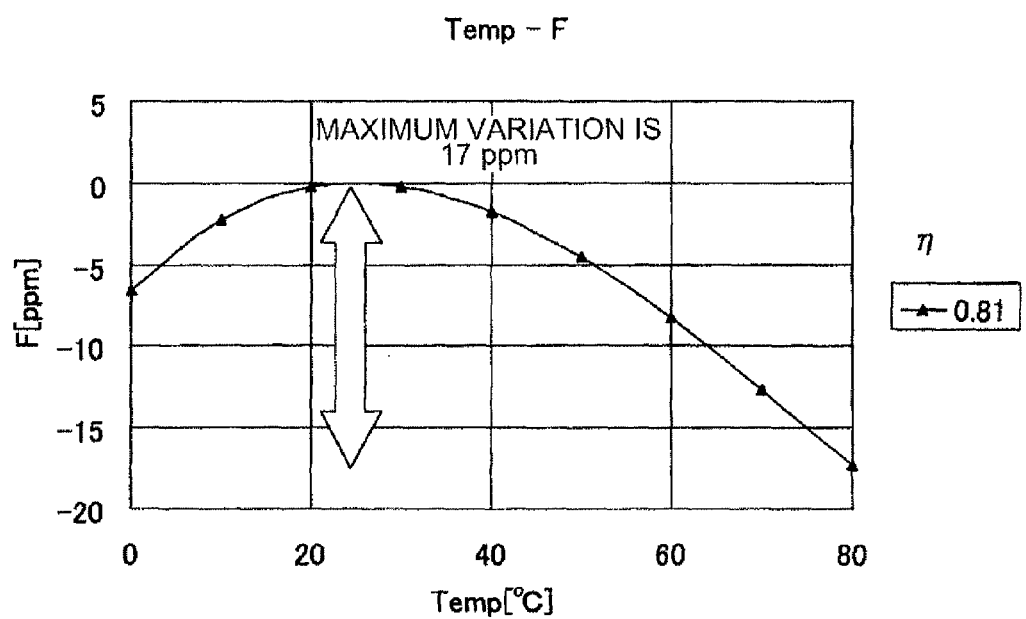
FIG. 5 is a graph showing a frequency temperature characteristic of the SAW device having the line metalization ratio η at which the frequency variation is maximum when the line metalization ratio η is varied.
Figure 6:
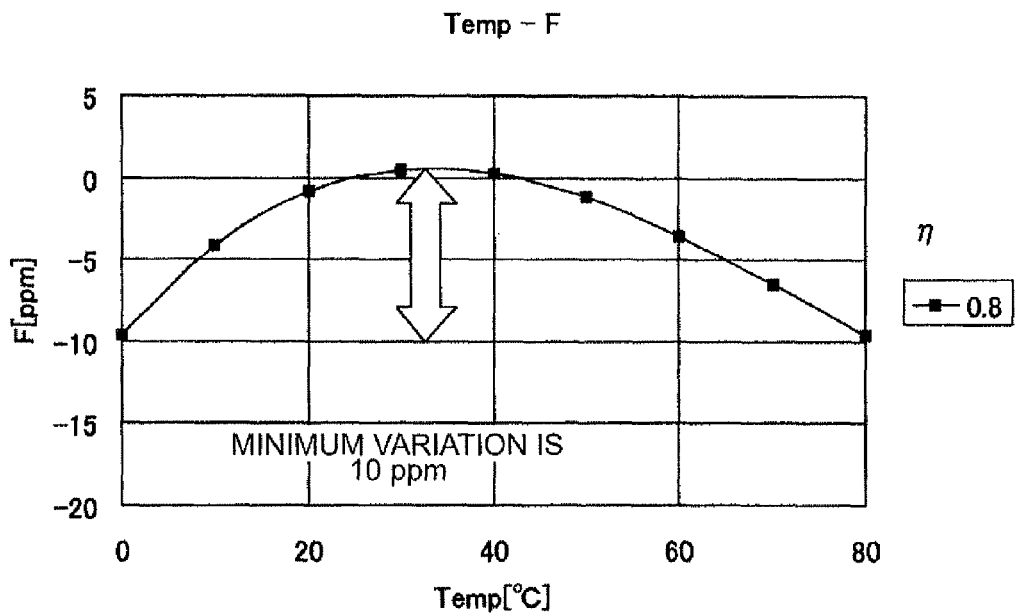
FIG. 6 is a graph showing a frequency temperature characteristic of the SAW device having the line metalization ratio η at which the frequency variation is minimum when the line metalization ratio η is varied.

Here, a graph shown in FIG. 4 shows a transition of the frequency variation when the depth of the grooves 28 is 0.3 µm, and the varied range of the line metalization ratio η is ±0.01, while a total thickness of the electrode finger base 30 and the electrode film of the IDT 16 and a total thickness of the conductor strip base 32 and the electrode film of the reflectors 24 are 0.6 μm (a thickness of the electrode is 0.3 μm) respectively. In the temperature range that is from 0 to 80 degrees Celsius shown in FIG. 4, the maximum value of the frequency variation is obtained when the line metalization ratio η of the SAW resonator is varied to the plus side, i.e., the line metalization ratio η=0.81. Specifically, in the temperature range described above, the frequency variation is 17 ppm (refer to FIG. 5). Further, the minimum value of the frequency variation is obtained when the line metalization ratio η of the SAW resonator is at the target value, i.e., the line metalization ratio η=0.8. In this case, the frequency variation in the temperature range from 0 to 80 degrees Celsius here is 10 ppm (refer to FIG. 6).

Based on the result above, the total thickness of the electrode finger base 30 and the electrode film of the IDT 16, and the total thickness of the conductor strip base 32 and the electrode film of the reflectors 24 are fixed at 0.6 μm respectively. Then, the digging amount of the grooves 28 is calculated in a range from 0 to 0.4 μm (i.e. a standardized base thickness Hd/H obtained by dividing a base thickness Hd by the total thickness H of the electrode film and the base is from 0 to 0.667). Values of the maximum variation (amount), the minimum variation (amount), and the average amount are respectively plotted in the graph in FIG. 7. In this case, the change of the depth of the grooves 28 indicates a change of the thicknesses (heights) of the electrode finger bases 30 and the conductor strip bases 32 and a ratio (proportion) of the thickness of the electrode film.

Figure 7:
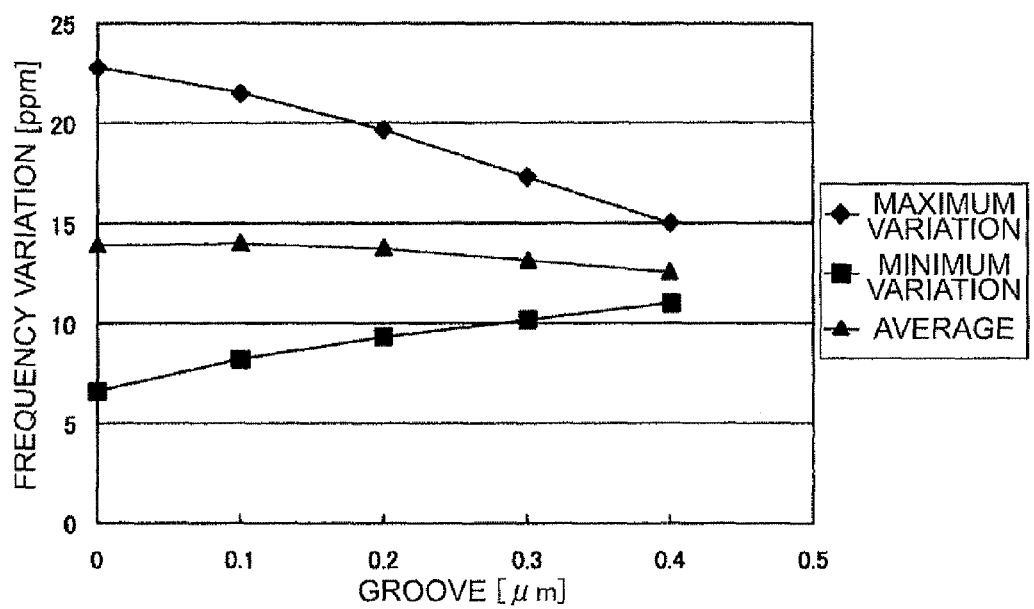
FIG. 7 is a diagram showing transitions of the minimum and maximum values of the frequency variation when a depth of grooves is changed.

According to the graph in FIG. 7, when the line metalization ratio η is varied by ±0.01, the depth of the grooves 28 needs to be 0.18 μm or more in order to obtain the frequency variation of 20 ppm or less in the temperature range from 0 to 80 degrees Celsius. If this is represented by a relation with the thickness of the electrode film, when the total thickness of the electrode finger base 30 and the electrode film, or the total thickness of the conductor strip base 32 and the electrode film is 0.6 μm, the depth of the grooves 28 is more than or equal to 30% of each thickness. That is, the standardized base thickness Hd/H should be 0.3 or more. Further, in order to suppress the variation of the frequency temperature characteristic within 15 ppm when the variation amount of the line metalization ratio η is ±0.01 (that is, a difference of the maximum value and the minimum value of the frequency variation), the depth of the grooves 28 needs to be 0.1 μm or more (i.e., the standardized base thickness Hd/H is 0.167 or more), and at least 0.5 μm or less (i.e., the standardized base thickness Hd/H is 0.833 or less).

In FIG. 7, in a range of the standardized base thickness Hd/H from 0.3 to 0.667 inclusive, the data of which the frequency variation at the temperature range from 0 to 80 degrees Celsius is 20 ppm or less is shown. That is, it is remarkably shown that the larger the standardized base thickness Hd/H becomes, the smaller the frequency variation caused by the temperature tends to be. Therefore, if the standardized base thickness Hd/H is more than 0.667 and at least 0.833 or less (0.5 μm or less), the frequency variation in the temperature range from 0 to 80 degrees Celsius can be 15 ppm or less.

Figure 8:
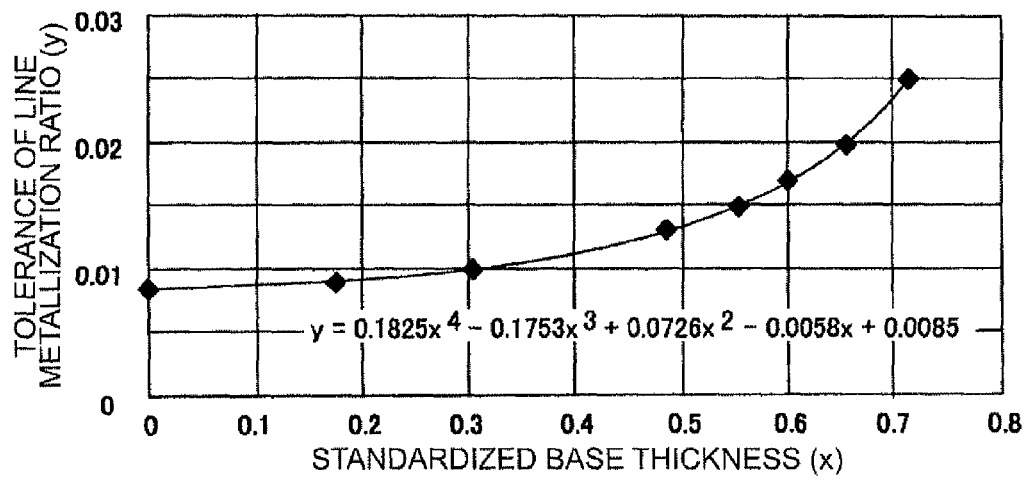
FIG. 8 is a graph showing a relation between the depth of the grooves and an error range of the line metalization ratio η when the grooves have the depth in which the frequency variations among individual SAW devices are within 20 ppm.

A tolerance (±y) of the line metalization ratio η to obtain the frequency variation of 20 ppm or less in the temperature range from 0 to 80 degrees Celsius is changed depending on the depth of the grooves 28. FIG. 8 shows a relation between the standardized base thickness Hd/H and the tolerance (±y) of the line metalization ratio η to obtain the frequency variation of 20 ppm or less in the temperature range from 0 to 80 degrees Celsius is changed depending on the depth of the grooves 28. In FIG. 8, the tolerance (±y) of the line metalization ratio η to obtain the frequency variation of 20 ppm or less in the temperature range from 0 to 80 degrees Celsius can be found. Further, according to FIG. 8, as the depth of the grooves 28 increases, the tolerance (±y) of the line metalization ratio η becomes exponentially larger. That is, when the line metalization ratio η to obtain the frequency variation of 20 ppm or less in the temperature range from 0 to 80 degrees Celsius is represented by ±y, the followings should be satisfied as shown in FIG. 8: η=0.8, and y=0.1825×(Hd/H)$^4$−0.1753×(Hd/H)$^3$+0.0726×(Hd/H)$^2$−0.0058(Hd/H)+0.0085.

Figure 9:
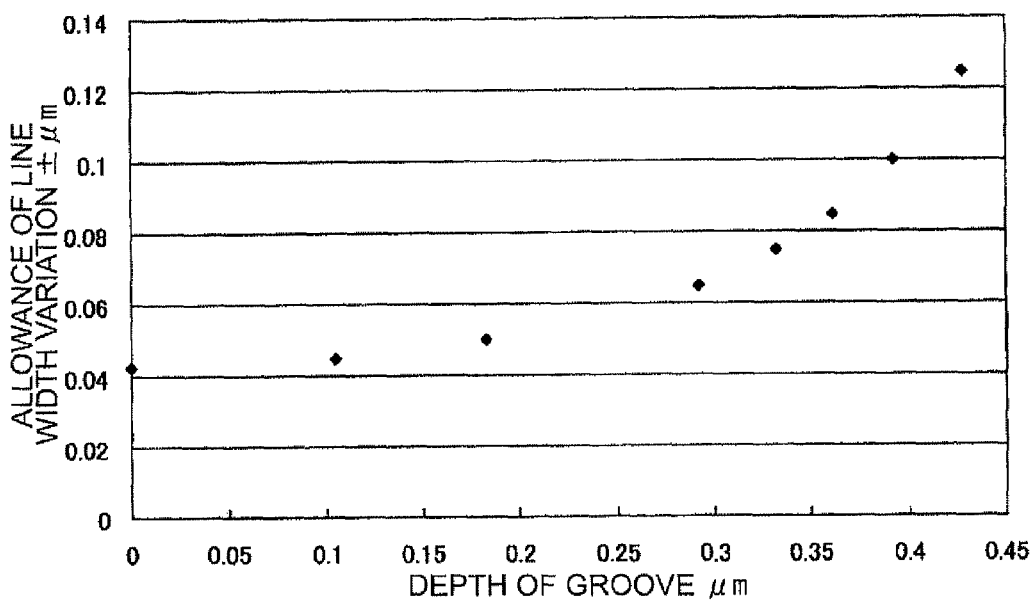
FIG. 9 is a graph in which an axis related to the line metalization ratio η in the graph shown in FIG. 8 is converted to an error of the width of the electrode fingers of an IDT in practice.

Further, the relation between the line metalization ratio η and the depth of the grooves 28 shown in FIG. 8 is converted to a relation between an actual width of the electrode fingers 22 and the depth of the grooves 28 as shown in FIG. 9. For example, according to the relation shown in FIG. 9, when an error of the width of the electrode fingers 22 is ±0.1 μm, the depth of the grooves 28 needs to be 0.4 μm or more.

According to experiments, even when the frequency temperature characteristic in the operating range varied due to an error of the line metalization ratio η, a big difference was not found in a second-order temperature coefficient indicating the frequency temperature characteristic. Resulting from this, it is found that a size of the frequency variation varies due to a shift of a peak temperature in the graph showing the frequency temperature characteristic. Therefore, by approximating the peak temperature, that is, by reducing a shift amount of the peak temperature with respect to the reference temperature, a slope of the graph showing the frequency variation in a predetermined temperature range is also approximated. Further, such a configuration can reduce the difference of the frequency variation between individual SAW devices, thereby improving total quality of the SAW devices to be produced.

Here, graphs of FIGS. 10A, 10B, 11A, and 11B show whether a difference in a transition amount of the peak temperature occurs or not between the SAW device 10 including the piezoelectric substrate 12 in which the grooves 28 are formed (FIGS. 10A and 10B) and a SAW device in which the grooves are not formed (FIGS. 11A and 11B) when the line metalization ratio η is changed. Examples shown in FIGS. 10A, 10B, 11A, and 11B are also examples of the SAW resonator having a resonant frequency of 322 MHz and show a shift of the peak temperature when the line metalization ratio η is changed from 0.8 to 0775. As described above, according to the graphs of FIGS. 10A, 10B, 11A, and 11B, it is found that even when the line metalization ratio η is changed, a large difference in the second-order coefficient showing the frequency temperature characteristic is not found. In FIGS. 10A, 10B, 11A, and 11B, a measuring temperature range of the frequency temperature characteristic is from 0 to 80 degrees Celsius.

Figure 10A:
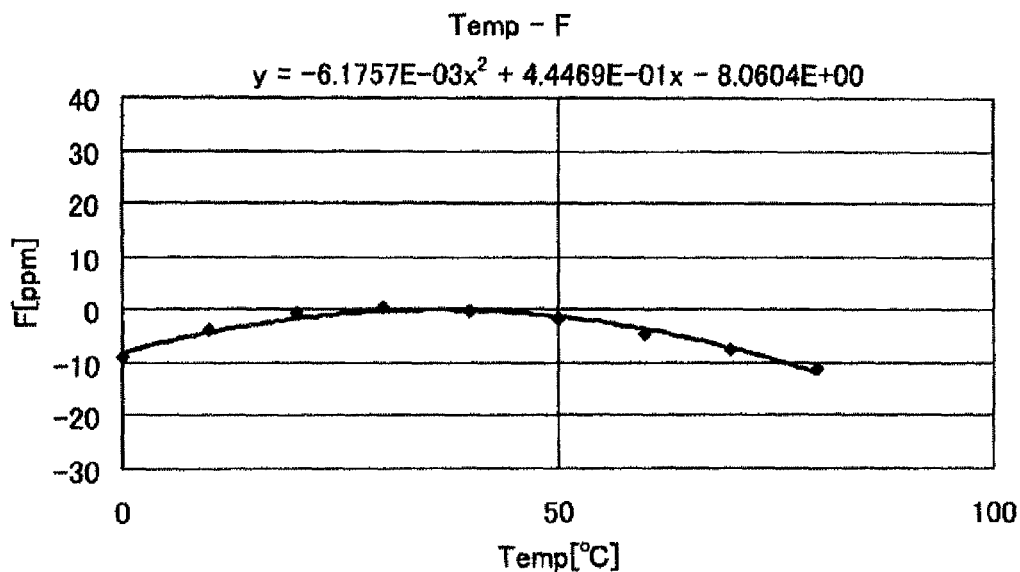
FIGS. 10A and 10B are diagrams showing a shift amount of a peak temperature in a case where the line metalization ratio of the SAW device having the grooves is changed.
Figure 10B:
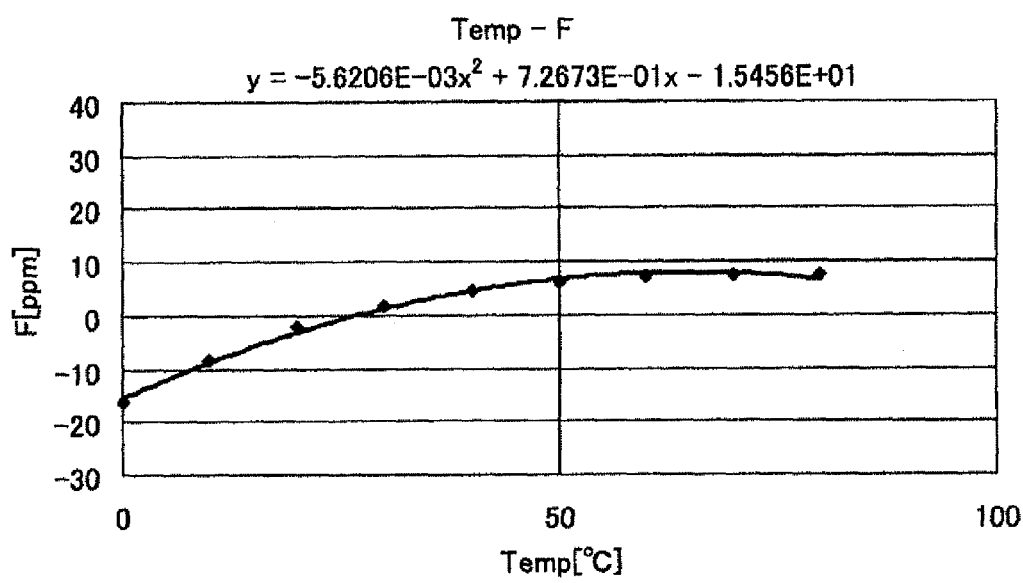

In the examples described above, the peak temperature of the SAW device in which the grooves 28 are formed is positioned at 35 degrees Celsius when the line metalization ratio η is 0.8 (refer to FIG. 10A). Further, the peak temperature of the SAW device 10 in which the grooves 28 are formed shifts to a position of 64 degrees Celsius when the line metalization ratio η is changed to 0.775 (refer to FIG. 10B).

Figure 11A:
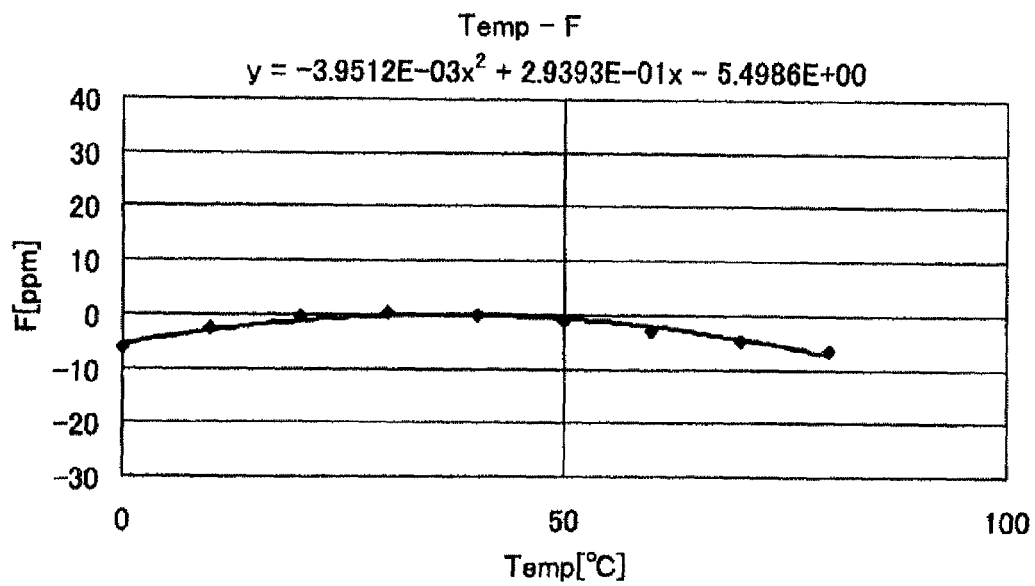
FIGS. 11A and 11B are diagrams showing a shift amount of a peak temperature in a case where the line metalization ratio of the SAW device not having the grooves is changed.
Figure 11B:
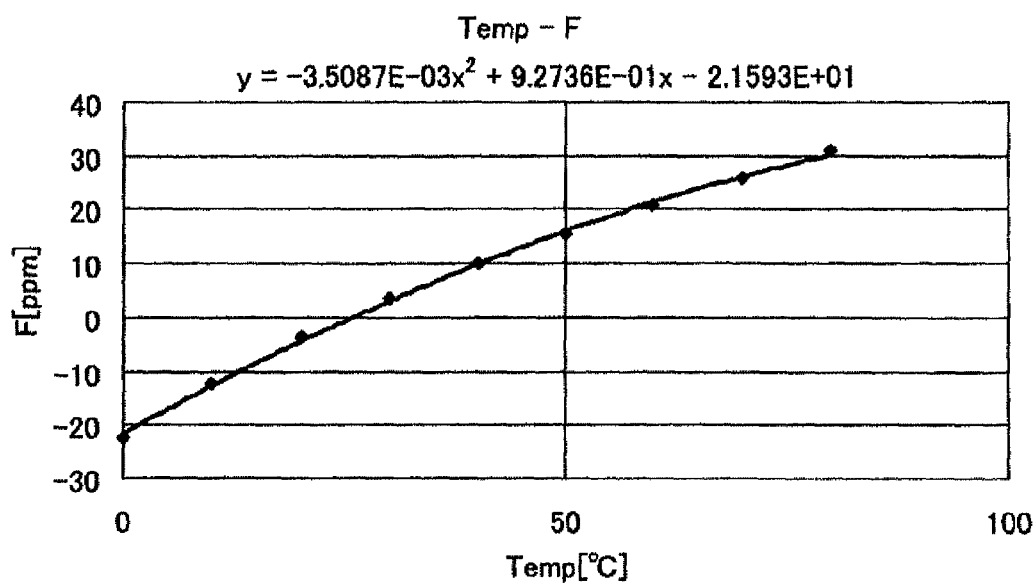

On the other hand, the peak temperature of the SAW device in which the grooves are not formed is positioned at 37 degrees Celsius when the line metalization ratio η is 0.8 (refer to FIG. 11A). Further, the peak temperature of the SAW device in which the grooves are not formed shifts to a position of 130 degrees Celsius (out of the measuring temperature range) when the line metalization ratio η is changed to 0.775 (refer to FIG. 11B).

According to the above, it is found that the difference of the frequency variation between the individual SAW devices caused by errors of the line metalization ratio η in the manufacturing process of the SAW device 10 can be reduced by forming the grooves 28 in the piezoelectric substrate 12 made of quartz crystal so as to have a depth corresponding to the film thickness of the excitation electrode 14. Further, such reduction of the difference of the frequency variation between the individual SAW devices is also realized by approximating the peak temperatures between the individual SAW devices.

In the manufacturing process of the SAW device 10 having the configuration as above, metal which is a material forming the excitation electrode 14 is deposited on a main surface of a wafer by vapor-depositing or sputtering first. Then, a shape of the IDT 16 and the reflectors 24 are formed by wet etching or the like. Next, a surface of the piezoelectric substrate 12 other than a portion in which the excitation electrode 14 is formed is dug out at a predetermined amount by dry etching so as to form the grooves 28. Here, the metal film forming the excitation electrode 14 may be used as a mask when dry etching is performed.

After the process above is completed and the IDT 16 and the reflectors 24 are formed on a main surface of the piezoelectric substrate 12, the wafer is divided to individual pieces by dicing or the like, so that the SAW device 10 is formed.

In the SAW device 10 having the configuration as the above according to the embodiment, the shift amount of the peak temperature of the frequency temperature characteristic of the SAW device 10 in an error range of the width of the electrode fingers 22 during the manufacturing process can be reduced by adjusting the depth of the grooves 28. Therefore, the difference of the frequency variation between manufactured individual SAW devices is reduced, thereby enabling the frequency variations of individual SAW devices to be within a tolerance. A manufacturing yield of the SAW device 10 is thus improved.

In the embodiment above, the total thickness H of the electrode film and the base is set to be 0.6 μm. However, the invention is not limited to this. Even when the total thickness H of the electrode film and the base is other than 0.6 μm, if a Rayleigh SAW device made of a quartz substrate with the Euler angle (0°,95°≦θ≦155°,33°≦|Ψ|≦46°), and using an upper limit mode of a stop band can provide advantageous effects that are similar to the embodiment above.

Further, as necessary, a protection film covering at least ones of the electrode fingers and the conductor strips may be formed.

Further, in the embodiment above, it is described that the grooves 28 are formed by digging out the whole surface of the piezoelectric substrate 12 except for the portion in which the excitation electrode 14 is formed. However, in practice, a case where the grooves 28 are formed in a portion contributing an excitation, e.g. only a portion between the electrode fingers 22 of the IDT 16, or the portion between the electrode fingers 22 of the IDT 16 and a portion between the conductor strips 26 of the reflectors 24, should be regarded as a part of the invention.

Figure 12:
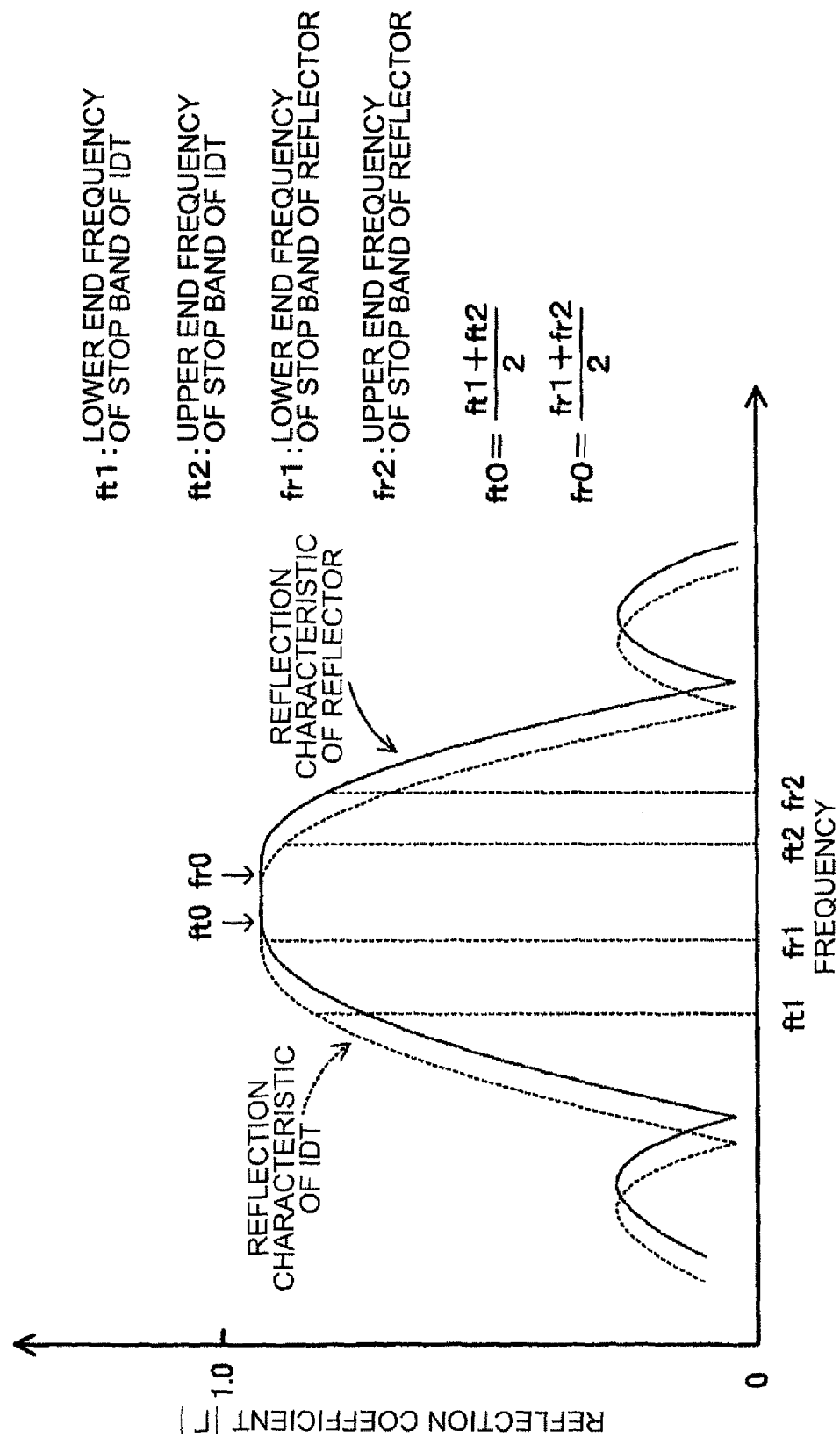
FIG. 12 is a diagram showing SAW reflection characteristics of the IDT and the reflector.

Further, in order to efficiently trap energy of a surface acoustic wave excited in an upper limit mode of a stop band, as shown in FIG. 12, an upper end frequency ft2 of the stop band of the IDT 16 may be set to between a lower end frequency fr1 of the stop band of the reflectors 24 and an upper end frequency fr2 of the stop band of the reflectors 24. That is, a relation of fr1<ft2<fr2 can be satisfied. According to this, a reflection coefficient |Γ| of the reflectors 24 increases in the upper end frequency ft2 of the stop band of the IDT 16, while the SAW in the upper limit mode of the stop band excited by the IDT 16 is reflected towards the IDT 16 with a high reflection coefficient at the reflectors 24. Then, the energy trapping of the SAW in the upper limit mode of the stop band becomes stronger, thereby realizing a low loss resonator. Here, when ft2, fr1, and fr2 are set so as to satisfy ft2<fr1 or fr2<ft2, the reflection coefficient |Γ| of the reflectors 24 becomes small in the upper end frequency ft2 of the stop band of the IDT 16, thereby making it hard to realize strong energy confinement.

In order to satisfy fr1<ft2<fr2, the stop band of the reflectors 24 needs to be shifted to a higher frequency than the stop band of the IDT 16. This can also make an arrangement cycle of the conductor strips of the reflectors 24 smaller than an arrangement cycle of the electrode fingers of the IDT 16. Other than the above, this can be realized by making the film thickness of the conductor strips of the reflectors 24 thinner than the film thickness of the electrode fingers of the IDT 16, or by making the depth of the grooves between the conductor strips of the reflectors 24 shallower than the depth of the grooves between the electrode fingers of the IDT 16. Further, a combination of two or more of these methods can be employed.

Further, in the embodiment above, only the SAW resonator is exemplified as an example of the SAW device 10, however, the SAW device of the invention includes a SAW filter or the like.

Furthermore, the SAW device 10 described in the embodiment above is a resonator including the reflectors 24. However, the SAW device 10 according to the embodiment includes an edge reflection type SAW resonator excluding reflectors.

Figure 13A:
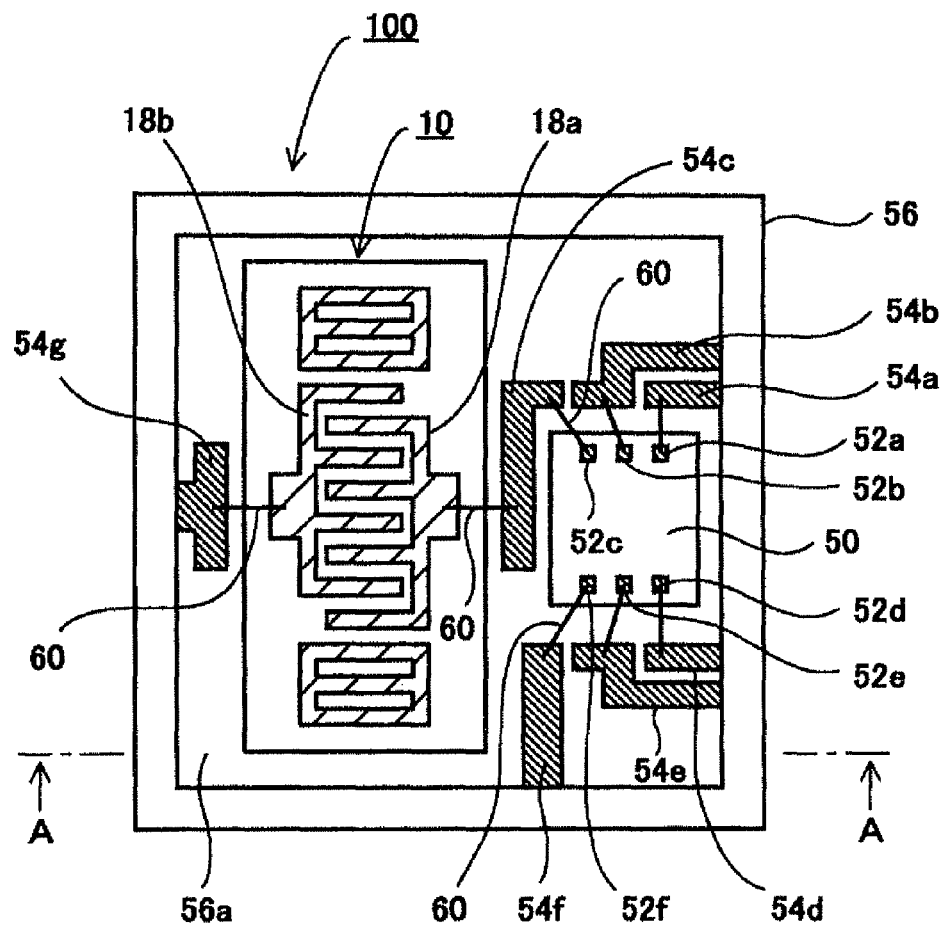
FIGS. 13A and 13B are diagrams showing a configuration of a SAW oscillator according to another embodiment.
Figure 13B:
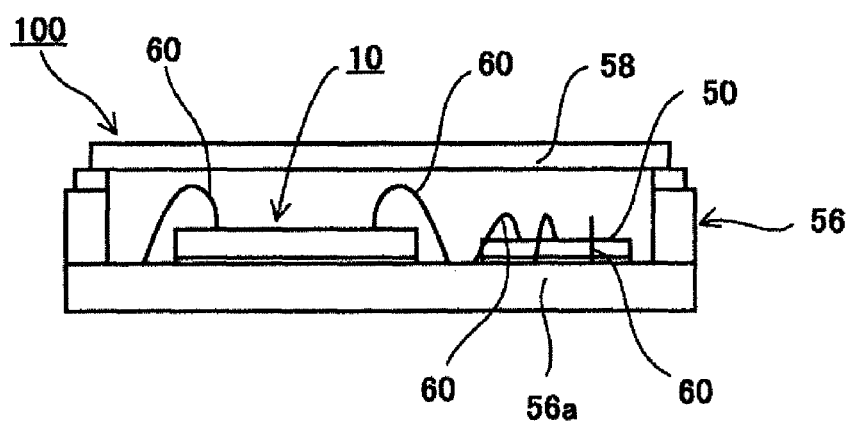

A SAW oscillator according to the invention is, as shown in FIGS. 13A and 13B, provided with the SAW device described above, an IC controlling an operation by applying a voltage to the IDT of the SAW device, and a package accommodating them. FIG. 13A is a plan view when a lid is removed and FIG. 13B is a view taken along a line A-A of FIG. 13A.

A SAW oscillator 100 according to the embodiment includes the SAW device 10 and an IC 50 which are accommodated in a single package, a package 56. The package 56 includes electrode patterns 54a through 54g formed on a bottom plate 56a of the package 56, the comb-tooth-shaped electrodes 18a and 18b of the SAW device 10, and pads 52a through 52f of the IC 50 that are coupled to each other by a metal wire 60. Further, a cavity of the package 56 accommodating the SAW device 10 and the IC is air-tightly sealed by a lid 58. In the configuration above, the IDT 16 (refer to FIG. 1), the IC 50, and an external mounting electrode (not illustrated) formed on a bottom surface of the package 56 can be electrically coupled.

The entire disclosure of Japanese Patent Application Nos: 2008-038951, filed Feb. 20, 2008 and 2008-287745, filed Nov. 10, 2008 are expressly incorporated by reference herein.

What is claimed is:
1. A surface acoustic wave device, comprising:
an interdigital transducer at least serving as an electrode pattern to excite a Rayleigh surface acoustic wave, the interdigital transducer including a comb-tooth-shaped electrode having a plurality of electrode fingers;
a piezoelectric substrate on which the interdigital transducer is formed, the piezoelectric substrate being made of a quartz substrate that is cut out at a cut angle represented by an Euler angle representation (φ, θ, ψ) of (0°, 95°≦θ≦155°, 33°≦|ψ|≦46°);
electrode finger grooves formed between the electrode fingers of the comb-tooth-shaped electrode;

electrode finger bases being quartz portions sandwiched between the electrode finger grooves and having upper surfaces on which the electrode fingers are positioned, wherein the surface acoustic wave device provides an excitation in an upper limit mode of a stop band of the surface acoustic wave;

a reflector formed at both sides of the interdigital transducer so as to sandwich the interdigital transducer in a propagation direction of the surface acoustic wave on a surface of the quartz substrate, the reflector including conductor strips;

conductor strip grooves formed between the conductor strips; and conductor strip bases being sandwiched between the conductor strip grooves and having upper surfaces on which the conductor strips are formed.

2. The surface acoustic wave device according to claim 1, wherein fr1<ft2<fr2 is satisfied, where an upper end frequency of a stop band of the interdigital transducer is ft2, a lower end frequency of a stop band of the reflector is fr1, and an upper end frequency of the stop band of the reflector is fr2.

3. The surface acoustic wave device according to claim 2, wherein the conductor strip grooves of the reflector are shallower than the electrode finger grooves of the interdigital transducer in depth.

4. A surface acoustic wave device, comprising:

an interdigital transducer at least serving as an electrode pattern to excite a Rayleigh surface acoustic wave, the interdigital transducer including a comb-tooth-shaped electrode having a plurality of electrode fingers;

a piezoelectric substrate on which the interdigital transducer is formed, the piezoelectric substrate being made of a quartz substrate that is cut out at a cut angle represented by an Euler angle representation ($\phi$, $\theta$, $\psi$) of (0°, 95°≦$\theta$≦155°, 33°≦|$\psi$|≦46°);

electrode finger grooves formed between the electrode fingers of the comb-tooth-shaped electrode; and electrode finger bases being quartz portions sandwiched between the electrode finger grooves and having upper surfaces on which the electrode fingers are positioned, wherein the surface acoustic wave device provides an excitation in an upper limit mode of a stop band of the surface acoustic wave, wherein a relation of a value y and a value Hd/H satisfies y=0.1825×(Hd/H)$^4$−0.1753×(Hd/H)$^3$+0.0726×(Hd/H)$^2$−0.0058×(Hd/H)+0.0085, where a line metalization ratio $\eta$ of the electrode fingers included in the interdigital transducer is 0.8±y, and the value Hd/H is obtained by dividing a thickness Hd of one of the electrode finger bases by a total thickness H of one of the electrode fingers and one of the electrode finger bases.

5. The surface acoustic wave device according to claim 4, wherein the value Hd/H is 0.167 or more.

6. The surface acoustic wave device according to claim 5, wherein the value Hd/H is from 0.3 inclusive to 0.833 inclusive.

7. A surface acoustic wave oscillator, comprising:

a surface acoustic wave device, comprising:

an interdigital transducer at least serving as an electrode pattern to excite a Rayleigh surface acoustic wave, the interdigital transducer including a comb-tooth-shaped electrode having a plurality of electrode fingers;

a piezoelectric substrate on which the interdigital transducer is formed, the piezoelectric substrate being made of a quartz substrate that is cut out at a cut angle represented by an Euler angle representation ($\phi$, $\theta$, $\psi$) of (0°, 95°≦$\theta$≦155°, 33°≦|$\psi$|≦46°);

electrode finger grooves formed between the electrode fingers of the comb-tooth-shaped electrode;

electrode finger bases being quartz portions sandwiched between the electrode finger grooves and having upper surfaces on which the electrode fingers are positioned, wherein the surface acoustic wave device provides an excitation in an upper limit mode of a stop band of the surface acoustic wave;

a reflector formed at both sides of the interdigital transducer so as to sandwich the interdigital transducer in a propagation direction of the surface acoustic wave on a surface of the quartz substrate, the reflector including conductor strips;

conductor strip grooves formed between the conductor strips; and conductor strip bases being sandwiched between the conductor strip grooves and having upper surfaces on which the conductor strips are formed; and an integrated circuit for driving the interdigital transducer.

* * * * *